(12) United States Patent
Kim et al.

(10) Patent No.: US 7,786,721 B2
(45) Date of Patent: Aug. 31, 2010

(54) MULTILAYER TYPE TEST BOARD ASSEMBLY FOR HIGH-PRECISION INSPECTION

(75) Inventors: Min-Gu Kim, Gyeonggi-do (KR);
Young-Soo An, Gyeonggi-do (KR);
Ho-Jeong Choi, Gyeonggi-do (KR);
Jung-Hyeon Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 189 days.

(21) Appl. No.: 12/006,543

(22) Filed: Jan. 3, 2008

(65) Prior Publication Data

US 2008/0164901 A1  Jul. 10, 2008

(30) Foreign Application Priority Data

Jan. 4, 2007  (KR) ...................... 10-2007-0000933

(51) Int. Cl.
*G01R 31/28*  (2006.01)
*G01R 31/26*  (2006.01)

(52) U.S. Cl. .................................... 324/158.1; 324/765
(58) Field of Classification Search ........................ None
See application file for complete search history.

(56) References Cited

U.S. PATENT DOCUMENTS

| | | | |
|---|---|---|---|
| 5,764,069 A * | 6/1998 | Cugini ........................ 324/761 |
| 6,661,248 B2 * | 12/2003 | Mori et al. .................. 324/765 |
| 6,861,858 B2 * | 3/2005 | Chen et al. .................. 324/755 |
| 7,042,243 B2 * | 5/2006 | Matsumoto .................. 324/763 |
| 7,058,865 B2 * | 6/2006 | Mori et al. ................... 714/724 |
| 7,492,174 B2 * | 2/2009 | Hall ............................ 324/754 |
| 2002/0109523 A1 * | 8/2002 | Vogley ........................ 324/765 |
| 2003/0048112 A1 | 3/2003 | Mori et al. |
| 2003/0062888 A1 | 4/2003 | Magliocco et al. |
| 2004/0239359 A1 * | 12/2004 | Matsumoto .................. 324/763 |
| 2006/0279305 A1 * | 12/2006 | Kim et al. .................... 324/763 |
| 2007/0184680 A1 * | 8/2007 | Choi et al. .................... 439/66 |

FOREIGN PATENT DOCUMENTS

JP     2003-75515     3/2003

* cited by examiner

*Primary Examiner*—Jermele M Hollington
(74) *Attorney, Agent, or Firm*—Mills & Onello, LLP

(57) ABSTRACT

There is provided a multilayer type test board assembly for high-precision inspection. The multilayer test board assembly comprises: a plurality of test boards separated from each other according to their functions, having input/output signal terminals, and including at least one test board each having a first section where first mounting devices sensitive to an influence of electrical signals are mounted and a second section where second mounting devices insensitive to an influence of electrical signals are mounted; spacers that arrange the test boards in parallel by spacing apart the test boards by predetermined intervals; connection cables connected to the input/output signal terminals of the test boards; and a signal shielding fence formed on each of the at least one test board so as to protect the first mounting devices from electrical signals generated by the second mounting devices.

11 Claims, 6 Drawing Sheets

MULTILAYER TYPE TEST BOARD ASSEMBLY FOR HIGH-PRECISION INSPECTION

CROSS-REFERENCE TO RELATED APPLICATION

This application claims the benefit of Korean Patent Application No. 10-2007-0000933, filed in the Korean Intellectual Property Office on Jan. 4, 2007, the contents of which are hereby incorporated herein by reference in their entirety.

BACKGROUND OF THE INVENTION

1. Field of the Invention

The present invention relates to a multilayer type test board assembly for high-precision inspection, and more particularly to a test board assembly for high-precision inspection capable of measuring a micro current and a low current by safely protecting the test board assembly from an influence of external signals.

2. Description of the Related Art

In general, a semiconductor device is manufactured by a fabrication process that includes forming patterns on a wafer and an assembling process that includes assembling the wafer having the patterns into unit chips.

An electric die sorting (EDS) process is performed between the fabrication and assembling processes that includes inspecting the electrical characteristics of the unit chips of the wafer.

In the EDS process, undesirable unit chips of the wafer are sorted and only the unit chips of high quality are subject to subsequent processes.

The EDS process mainly uses a tester, which is an inspection apparatus that applies electrical signals to the unit chips to determine whether the unit chips are acceptable by checking signals from the applied electrical signals.

The tester is provided with a test board that applies electrical signals to the unit chips and that receives electrical signals from the chips.

However, since a conventional test board performs various functions using devices such as an analog-to-digital (A-D) converter, a digital-to-analog (D-A) converter, a micro control unit (MCU), and a measure probe simultaneously, the size of the test board can be excessively large. If the size of the test board is large, the head size of the tester is also large. Therefore, a sufficient work space is necessary to utilize the tester, which is uneconomical.

In order to solve this problem, a technology in which test boards are separated according to their functions, and are spaced apart from each other by a predetermined interval, has been suggested. Japanese Patent Laid-Open No. 2003-75515, entitled "Tester for Semiconductor Integrated Circuit and its Testing Method," incorporated herein in its entirety by reference, discloses a structure in which multifunctional substrates are divided and multilayered.

FIG. 1 is a side sectional view of a conventional structure 100 in which test boards TB are multilayered.

As shown in FIG. 1, the structure 100 includes a plurality of test boards or substrates TB, that are multilayered at predetermined intervals by separating the substrates or test boards TB according to their functions using spacers S. This results in a significant reduction in the area size of the test boards TB. Thus, the amount of space for mounting a tester and a tester head in test equipment is reduced, which is economical.

However, the test equipment not only performs a function of determining whether unit devices such as a semiconductor device are acceptable, but the test equipment also precisely measures output signals received from the unit devices being tested. Here, a plurality of mounting devices are mounted to the test boards TB, and are used in performing precise measurements. However, the mounting devices generate natural signals, such as electrical signals.

Therefore, since those mounting devices related to precise measurements of the test boards may react sensitively to external electrical signals, for example, from other mounting devices generating natural signals, while measuring the output signals from the unit devices, the ability for the test equipment to take precise measurements may be limited due to the influence of the external signals on the mounting devices.

SUMMARY OF THE INVENTION

Therefore, the present invention provides a multilayer type test board assembly for high-precision inspection allowing a precise low current measurement by forming a fence capable of minimizing or interrupting influence of signals on mounting devices mounted to the test board assembly.

The present invention also provides a multilayer type test board assembly for high-precision inspection capable of safely protecting mounting devices in a section sensitive to external electrical signals from electrical signals of the other section.

In an aspect, the present invention is directed to a multilayer test board assembly for high-precision inspection, comprising: a plurality of test boards separated from each other according to their functions, having input/output signal terminals, and including at least one test board each having a first section where first mounting devices sensitive to an influence of electrical signals are mounted and a second section where second mounting devices insensitive to an influence of electrical signals are mounted; spacers that arrange the test boards in parallel by spacing apart the test boards at predetermined intervals; connection cables connected to the input/output signal terminals of the test boards; and a signal shielding fence formed on each of the at least one test board so as to protect the first mounting devices from electrical signals generated by the second mounting devices.

In an embodiment, a ground line is formed on each of the at least one test board and the signal shielding fence is connected to the ground line.

In an embodiment, the signal shielding fence has a closed circuit shape surrounding any one of the first section and the second section.

In an embodiment, the signal shielding fence is formed of a conductor. In an embodiment, the conductor is a metal.

In an embodiment, the signal shielding fence has a height that is higher than a height of the highest of the first and second mounting devices.

In another aspect, the present invention is directed to a multilayer test board assembly for high-precision inspection, comprising: a plurality of test boards separated from each other according to their functions, having input/output signal terminals, and including adjacent first and second test boards, the second test board being positioned over the first test board, and the first board having a first section where first mounting devices sensitive to an influence of electrical signals are mounted and a second section where second mounting devices insensitive to an influence of electrical signals are mounted; spacers that arrange the test boards in parallel by spacing apart the test boards by predetermined intervals; connection cables connecting the input/output signal terminals of the test boards; and a signal shielding fence boned to a first ground line formed on the first test board and being in contact with a second ground line formed on a surface of the second test board facing the first ground line so as to protect the first mounting devices from electrical signals generated by the second mounting devices.

In an embodiment, the signal shielding fence is formed of a conductor. In an embodiment, the conductor is a metal.

In an embodiment, the signal shielding fence has a closed circuit shape surrounding any one of the first section and the second section.

In an embodiment, the signal shielding fence has a height that is higher than a height of the highest of the first and second mounting devices.

The present invention relates to a multilayer type test board assembly arranging a plurality of test boards in parallel.

The test board assembly includes a plurality of test boards divided according to their functions.

The test boards are provided in a tester head of a tester used in a test of a unit device including a semiconductor device to transmit electrical signals required for various electrical tests for the unit device and to detect signals output from the unit device.

In the test boards, devices such as resistors, condensers, and transistors having various sizes and heights and natural functions are mounted to a printed circuit board. A terminal for input/output of electrical signals is provided at one end or both ends of the test board.

In the multilayer type test board assembly, the test boards are divided into a plurality of test boards according to their functions and are arranged in parallel by spacing apart the test boards by predetermined intervals using separate spacers.

That is, the test boards independently perform various functions of devices such as an analog-digital (A-D) converter, a digital-analog (D-A) converter, a micro control unit (MCU), and a measure probe and are arranged in parallel by spacing apart the test boards by predetermined intervals.

On the other hand, the spaced intervals between test boards are higher than at least the heights of the mounting devices mounted to the test boards to prevent interference between the mounting devices and the test boards.

In particular, the mounting devices have sufficient intervals so as not to electrically influencing the functions of the adjacent test boards.

In the multilayer type test board assembly, the mounting devices sensitively influenced by electrical signals are prevented from being influenced by mutual electrical signals in the relation to the mounting devices bonded to a same flat surface of the test boards.

BRIEF DESCRIPTION OF THE DRAWINGS

The above and other features and advantages of the present invention will become more apparent to those of ordinary skill in the art by describing in detail preferred embodiments thereof with reference to the attached drawings. The drawings are not necessarily to scale, emphasis instead being placed upon illustrating the principles of the invention. In the drawings, the thicknesses of layers and regions are exaggerated for clarity. Like numbers refer to like elements throughout the specification.

DETAILED DESCRIPTION OF THE INVENTION

A multilayer type test board assembly according to the present invention will now be described more fully hereinafter with reference to the accompanying drawings, in which exemplary embodiments of the invention are shown. This invention may, however, be embodied in different forms and should not be construed as limited to the embodiments set forth herein.

It will also be understood that when an element such as a layer, region or substrate is referred to as being on another element, it can be directly on the other element or intervening elements may also be present, or it can be partially or completely in the other element. In contrast, if an element is referred to as being directly on another element, then no other intervening elements are present.

Figure 1:
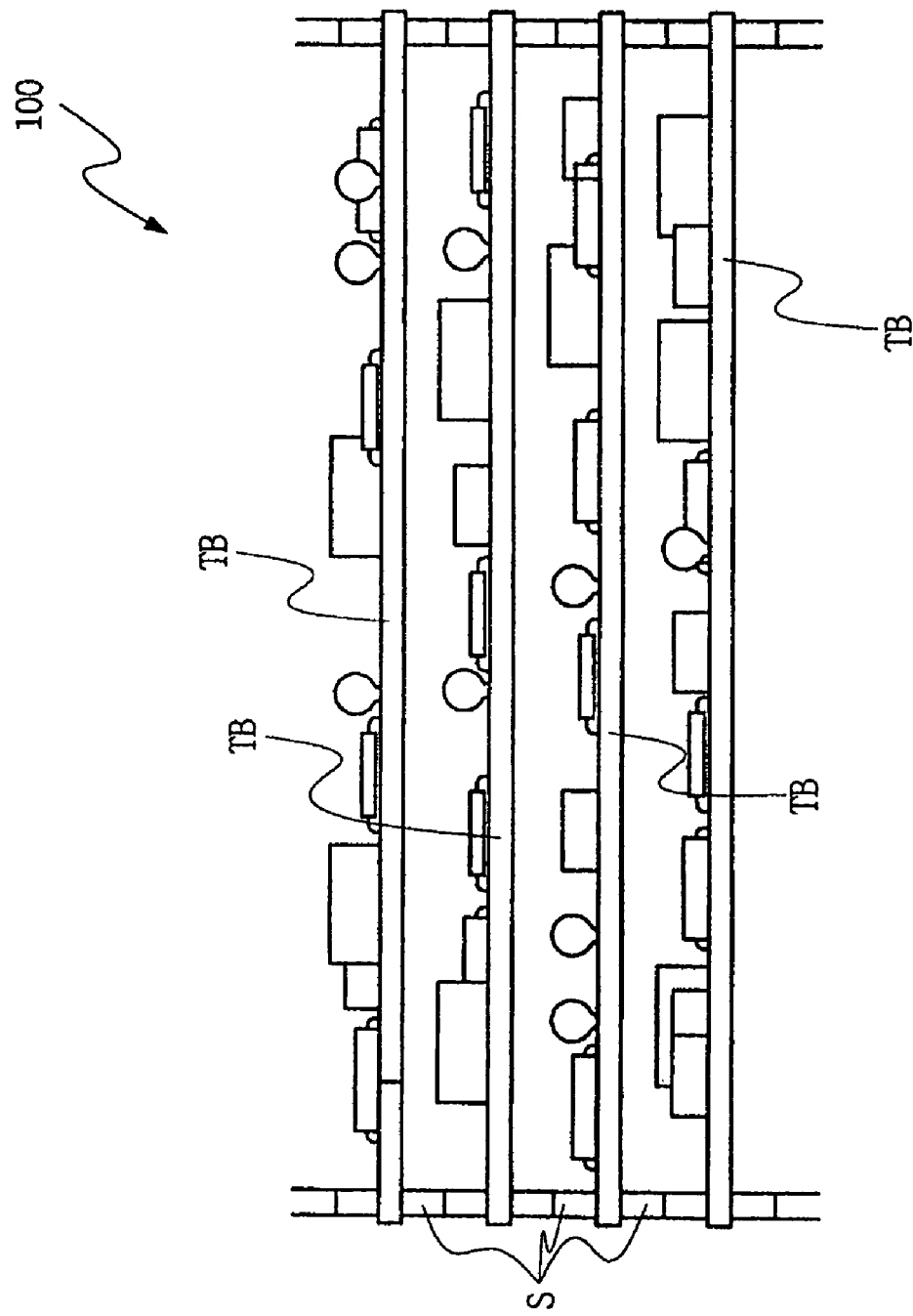
FIG. 1 is a schematic side sectional view of a conventional structure in which test boards are multilayered.
Figure 2:
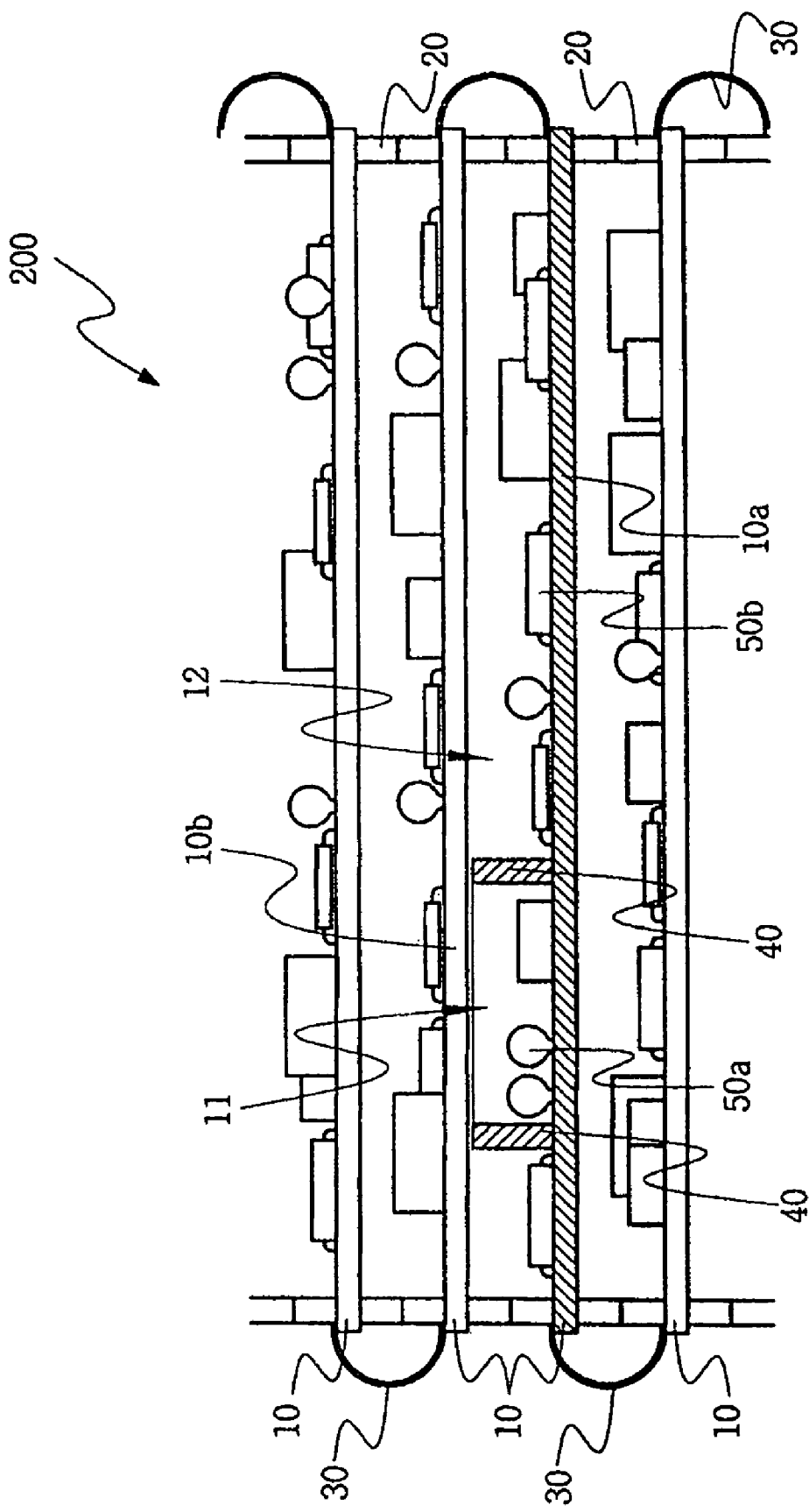
FIG. 2 is a schematic side sectional view of a multilayer type test board assembly for high-precision inspection according to an embodiment of the present invention.

FIG. 2 is a schematic side sectional view of a multilayer type test board assembly 200 for high-precision inspection according to an embodiment of the present invention.

As shown in FIG. 2, a multilayer type test board assembly 200 comprises a plurality of test boards 10 that include test boards 10a and 10b and are spaced apart from each other using spacers 20. In one embodiment, the test boards 10 are separated from each other according to their functions. The test boards 10 are electrically connected to each other by mutual connection cables 30 to input and output electrical signals. Specifically, the test boards 10 each have an input/output signal terminal (not shown) on at least one side end of the test board 10, wherein the connection cables 30 are connected to the input/output signal terminals of the test boards 10. In one embodiment, the connection cable 30 is a conventional flat cable. In another embodiment, the test boards 10 are directly connected to each other by a male/female connector instead of the connection cable 30.

A signal shielding fence 40 is provided on, for example, the test board 10a to which mounting devices 50a requiring protection from the influence of external signals are bonded, so as to discriminate between one section 11 of the test board 10a that includes the mounting devices 50a, which are sensitive to electrical signal influences, and other sections that include mounting devices 50b insensitive to an influence of electrical signals, such as section 12 of the test board 10a.

The test boards 10 include the test board 10a on which the mounting devices 50a that sensitively react to external electrical signals are provided. Since the mounting devices 50a are generally concentrated in a predetermined portion of the test board 10a, for example, section 11 of the test board 10a, the signal shielding fence 40 is adapted to discriminate between section 11, in which the mounting devices 50a sensitively react to electrical signals, and section 12. The signal shielding fence 40 thereby protects section 11 from electrical signals that may be generated in mounting devices of other sections, such as section 12.

The signal shielding fence 40 can be integrally and firmly bonded to a same surface as the bonding surface of the mounting devices 50a, 50b in the test board 10a. This further permits section 11 to be safely protected from the influence of electrical signals of section 12 by the signal shielding fence 40.

Preferably, the signal shielding fence 40 can be connected to a ground line (not shown in FIG. 2) on the test board 10a. That is, the signal shielding fence 40 forms a transfer passage of the electrical signals generated in the mounting devices 50a, 50b of the test board 10a, and performs a shielding function that prevents the electrical signals from being transferred between the mounting devices 50a and the mounting devices 50b, which are separated from each other by the signal shielding fence 40. Instead of being transferred from mounting devices 50b to mounting devices 50a, the electrical signals are transferred through the ground line on the test board 10a.

Therefore, the signal shielding fence 40 guides the electrical signals and interrupts an influence of the electrical signals between the separated sections 11 and 12.

The signal shielding fence 40 is preferably formed of a conductor, such as a metal.

Figure 3:
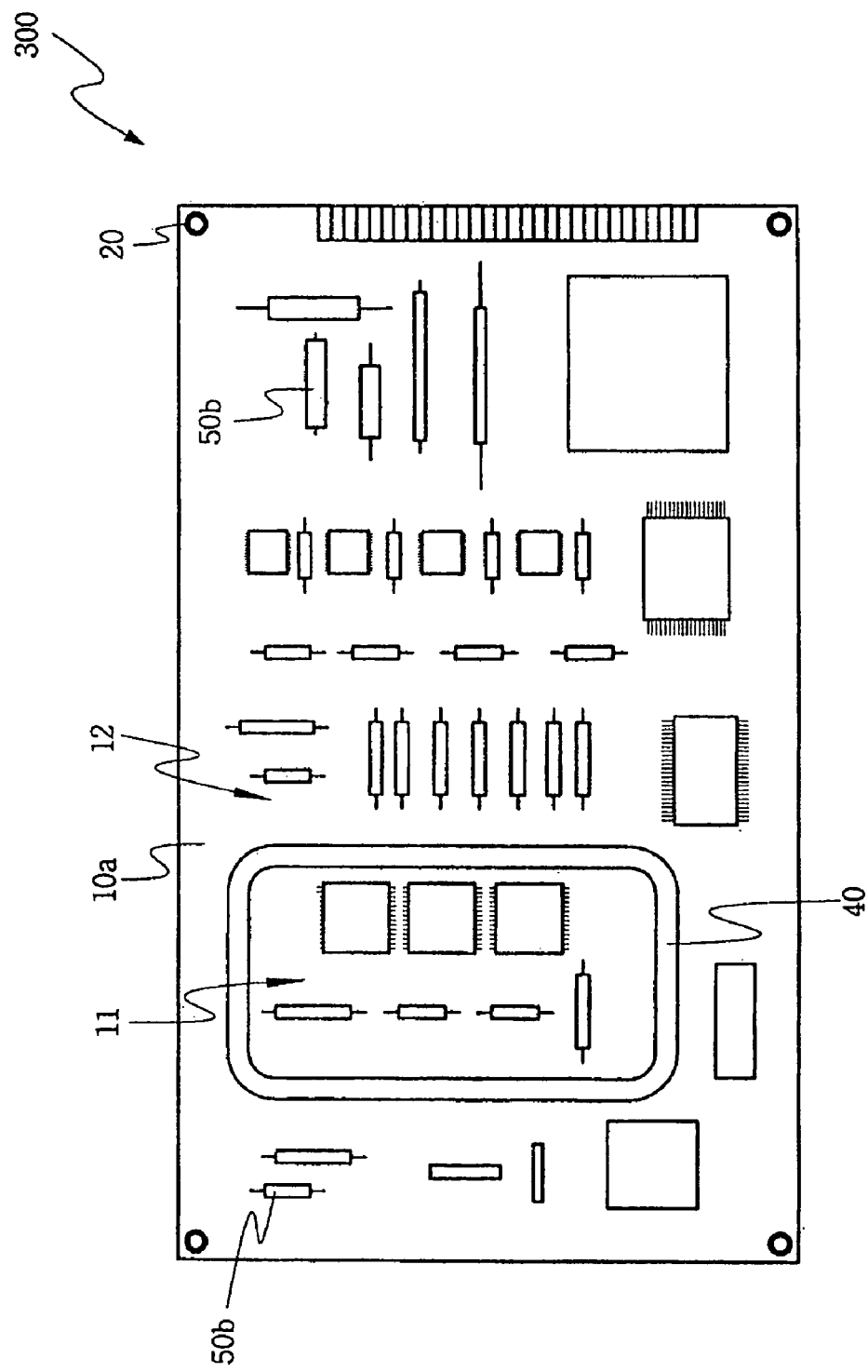
FIG. 3 is a schematic plan view of a structure comprising a signal shielding fence according to an embodiment of the present invention.

FIG. 3 is a schematic plan view of a structure 300 comprising a signal shielding fence 40 according to an embodiment of the present invention.

As shown in FIG. 3, the signal shielding fence 40 is formed in a closed circuit shape surrounding section 11, which is sensitive to influence of electrical signals, so as to discriminate between a section sensitive to an influence of electrical signals, for example, section 11, and other sections, for example, section 12. In the case in which an area of section 11 sensitive to electrical signals is relatively large as compared to section 12, the signal shielding fence 40 can have a closed circuit shape surrounding the small area of section 12 rather than the larger area of section 11.

The signal shielding fence 40 can have a height that is higher than a height of the highest of the mounting devices 50a and 50b mounted to the test board 10a. Further, test board 10a and test board 10b are spaced apart from each other by a predetermined distance, or height, and the signal shielding fence 40 can have a height that is less than the height between the test board 10a and the test board 10b.

In an embodiment, when section 11 of the test board 10a that is sensitive to the influence of electrical signals and section 12 of the test board 10a are separated from each other in the test board 10a, in part, by the signal shielding fence 40, a precise electrical inspection can be safely performed through the mounting devices 50a in section 11 to allow a precise and accurate inspection to be achieved.

Figure 4:
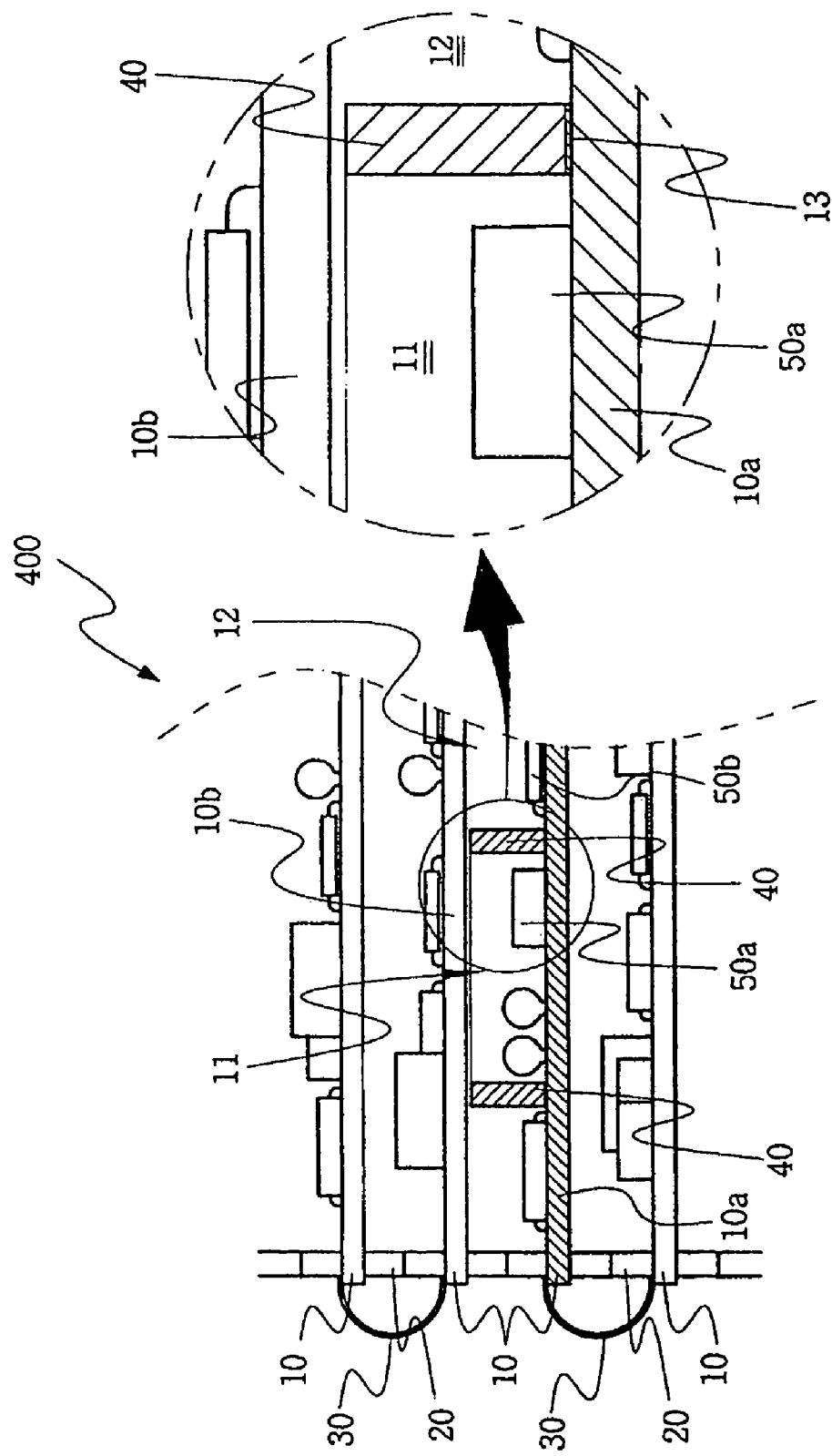
FIG. 4 is a schematic side sectional view of a multilayer type test board assembly for high-precision inspection according to an embodiment of the present invention.

FIG. 4 is a schematic side sectional view of a multilayer type test board assembly 400 for high-precision inspection according to an embodiment of the present invention.

As shown in FIG. 4, the assembly 400 has a structure in which a plurality of test boards 10 including test boards 10a and 10b are spaced apart from each other by a predetermined interval using spacers 20, and the test boards 10 are electrically connected to each other by mutual connection cables 30 to input and output mutual electrical signals. In one embodiment, the connection cable 30 is a conventional flat cable. In another embodiment, the test boards 10 are directly connected to each other by a male/female connector instead of the connection cable 30.

The test board 10a of the test boards 10 comprises a ground line 13 having a predetermined width, to which mounting devices requiring protection are bonded, to discriminate between a section 11 of the test board 10a including mounting devices 50a sensitive to an influence of electrical signals from an adjacent section 12 comprising mounting devices 50b insensitive to an influence of electrical signals. The test board 10a further comprises a signal shielding fence 40 having a predetermined height that is positioned on the ground line 13.

In an embodiment, the mounting devices 50a of the test board 10a are especially sensitively reactive to external electrical signals, and are concentrated at a predetermined portion of the test board 10a.

Figure 5:
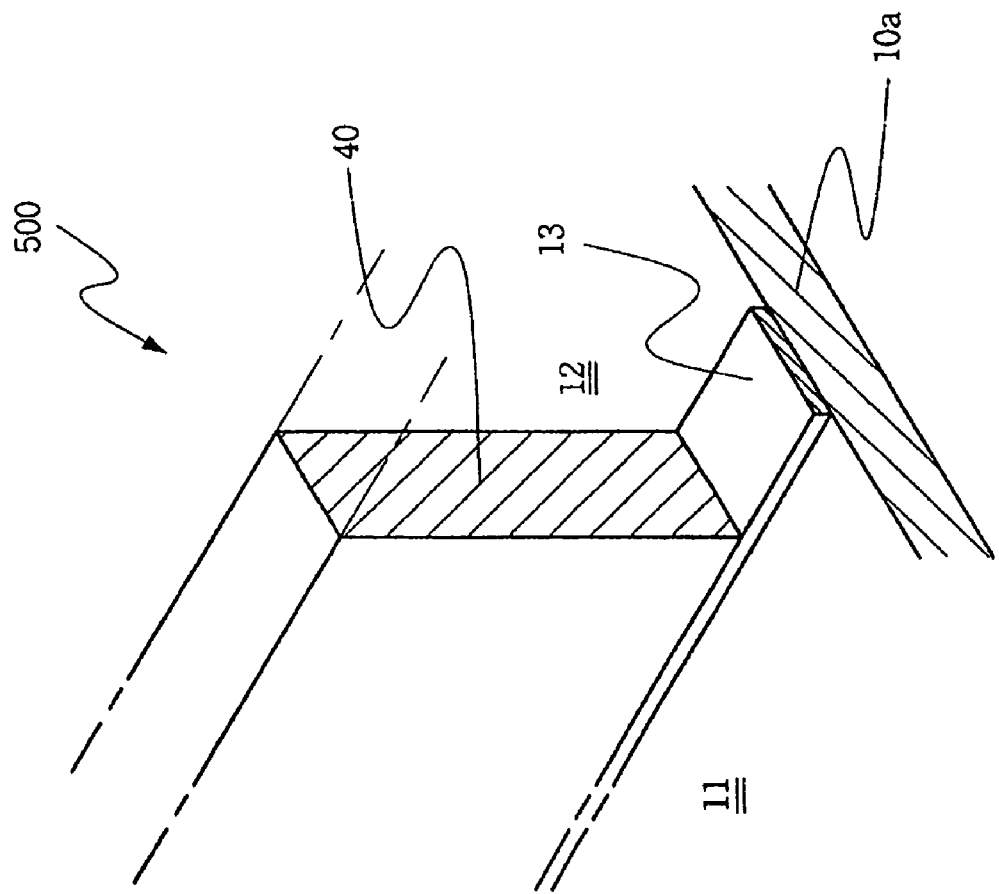
FIG. 5 is a partially enlarged schematic perspective view of the shapes of a ground line and a signal shielding fence according to an embodiment of the present invention.

FIG. 5 is a partially enlarged schematic perspective view of shapes of a ground line 13 and a signal shielding fence 40 according to an embodiment of the present invention.

In an embodiment, a ground line 13 having a predetermined width is on a border between a section 11 in which mounting devices sensitively reacting to electrical signals are provided, and another section 12, to discriminate between section 11 and section 12. A signal shielding fence 40 having a predetermined height is provided on the ground line 13.

The signal shielding fence 40 is formed along the ground line 13, which is connected to an input/output terminal (not shown), one end of which is at one end of a test board 10a.

The ground line 13 can be on a surface of the test board 10a where the mounting devices are bonded, and a lower end of the signal shielding fence 40 can be bonded to the ground line 13. In this manner, section 11, which is sensitive to an influence of electrical signals, is safely protected from the influence of signals of section 12 by the signal shielding fence 40.

In an embodiment, the ground line 13 and the signal shielding fence 40 can have a same width.

The ground line 13 and the signal shielding fence 40 form a transfer passage for electrical signals generated by the mounting devices of the test board 10a, and perform a shielding function by which the electrical signals are prevented from crossing or otherwise penetrating the signal shielding fence 40, whereby the electrical signals cannot be transferred between mounting devices 50a, 50b, respectively, which are separated from each other by the ground line 13 and the signal shielding fence 40.

The signal shielding fence 40 is preferably formed of a conductor, such as a metal.

In an embodiment, since the signal shielding fence 40 is adapted to discriminate between a section 11 that is sensitive to influence of electrical signals, and other sections, for example, section 12, the fence 40 has a closed circuit shape surrounding the section 11 that is sensitive to electrical signals.

Alternatively, in the case in which the section 11 sensitive to electrical signals has an area that is relatively large as compared to section 12, the signal shielding fence 40 preferably can have a closed circuit shape surrounding the small area section rather than the large area section.

Further, the signal shielding fence 40 is at a height that is higher than a height of the highest one of the mounting devices 50a mounted to the test board 510a, and the signal shielding fence 40 can have a height that is lower than the distance of which the test board 10a and the neighboring test board 10b are spaced apart.

In an embodiment, if the section 11 sensitive to the influence of electrical signals and the other section 12 are separated from each other on the test board 10a by the ground line 13 and the signal shielding fence 40, the influence of the electrical signals can be completely interrupted and a precise electrical inspection can be safely performed through the mounting devices 50a included in the section 11 that is sensitive to the influence of the electrical signals, to allow a precise and accurate inspection, for example, of unit chips.

Figure 6:
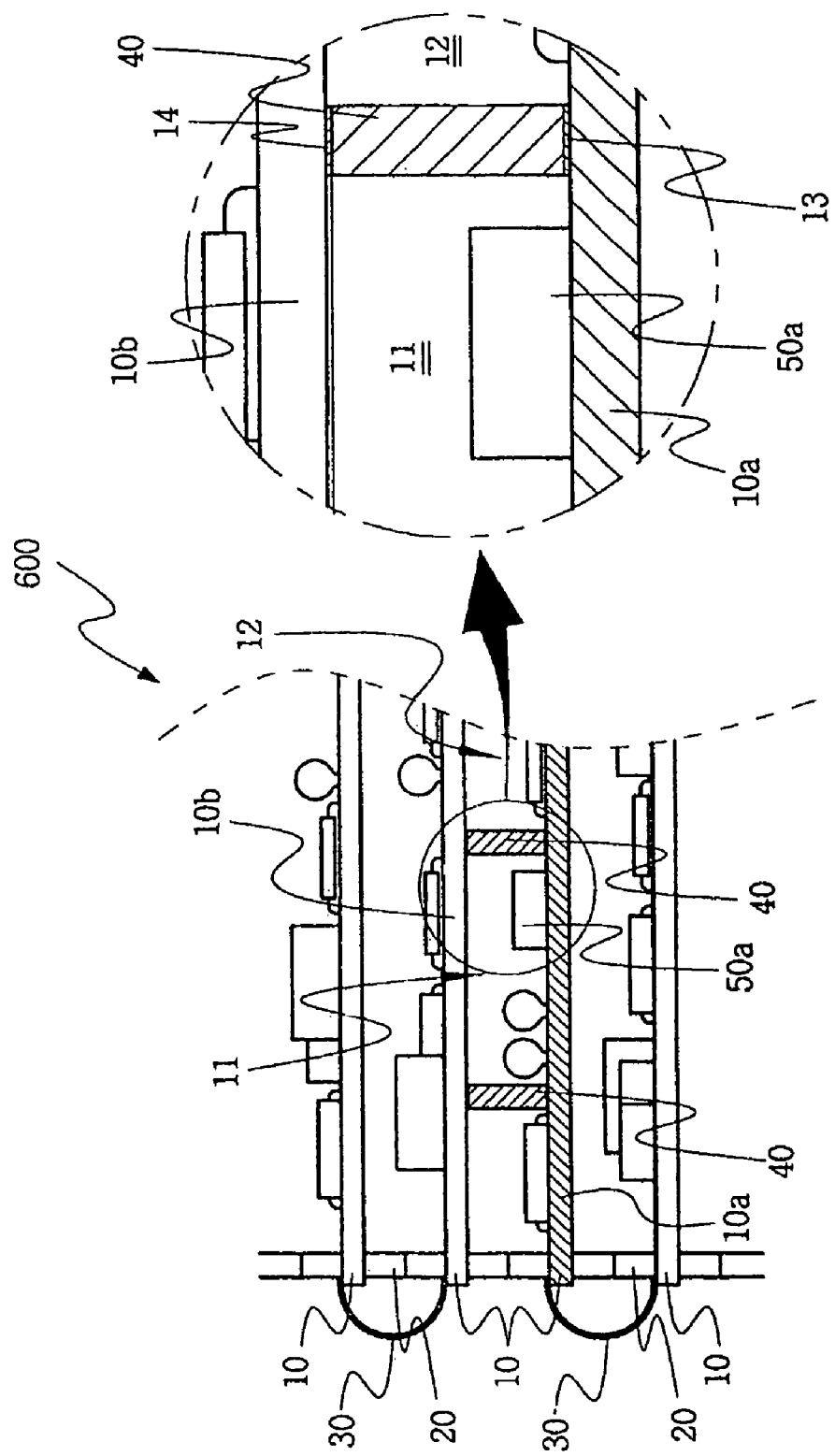
FIG. 6 is a schematic side sectional view of a multilayer type test board assembly for high-precision inspection according to an embodiment of the present invention.

FIG. 6 is a schematic side sectional view of a multilayer type test board assembly 600 for high-precision inspection according to an embodiment of the present invention.

The multilayer type test board assembly 600 has a structure in which a plurality of test boards 10 including test boards 10*a* and 10*b* are spaced apart from each other by a predetermined interval using spacers 20, and the test boards 10 are electrically connected to each other by mutual connection cables 30 to input and output mutual electrical signals. In one embodiment, the connection cable 30 is a conventional flat cable. In another embodiment, the test boards 10 are directly connected to each other by a male/female connector instead of the connection cable 30.

In an embodiment, a first ground line 13 having a predetermined width is on the test board 10*a* of the test boards 10, to which mounting devices requiring protection are bonded, to discriminate between a section 11 including mounting devices 50*a* sensitive to influence of electrical signals and another section 12 including mounting devices 50*b* insensitive to an influence of electrical signals. A signal shielding fence 40 having a predetermined height is provided on the first ground line 13. A second ground line 14 having a same shape as the signal shielding fence 40 is bonded to a test board 10*b*, and is formed on the test board 10*b* facing a side of the test board 10*a* on which the mounting devices are provided.

That is, the ground line 13 is along a portion dividing section 11 that is sensitive to an influence of electrical signals from other sections, for example, section 12 of test board 10*a*, which includes mounting devices requiring protection. The second ground line 14 having a same pattern as the first ground line 13 is on the test board 10*b* facing the first ground line 13. Further, the signal shielding fence 40 is provided between the first and second ground lines 13, 14 having a predetermined height so that one end of the signal shielding fence 40 is bonded to the first ground line 13 and the other end of the signal shielding fence 40 is in contact with the second ground line 14.

In an embodiment, the multilayer type test board assembly 600 includes the test board 10*a* having the mounting devices 50*a* sensitively reacting in particular to the external electrical signals of other mounting devices 50*b*, wherein the mounting devices 50*a* are generally concentrated to a predetermined portion of the test board 10*a*.

In order to discriminate between section 11 in which the mounting devices 50*a* sensitively reacting to electrical signals are concentrated and the other section 12, the first ground line 13 having a predetermined width is positioned on the border portion, and the signal shielding fence 40 having a predetermined height is provided along the first ground line 13.

The signal shielding fence 40 is along the first ground line 13, but one end of the first ground line 13 is connected to an input/output signal terminal (not shown) formed at one end of the test board 10*a*.

In an embodiment, the first ground line 13 is on a same surface as the bonding surface of the mounting devices in the test board 10*a*, and one end portion of the signal shielding fence 40 is firmly bonded to the first ground line 13 formed on the test board 10*a*.

On the other hand, the second ground line 14 is formed on the test board 10*b*, and is in the same direction in which the signal shielding fence 40 is formed so as to have a same shape as the signal shielding fence 40. One end of the second ground line 14 formed on the test board 10*b* is connected to the input/output signal terminal in the test board 10*b*.

Therefore, the first ground line 13 on the test board 10*a* and the second ground line 14 on the test board 10*b* can have a same shape, but if the positions of input/output signal terminals are different, the portions of the first and second ground lines 13, 14, which are connected to the input/output signal terminals, respectively, may be different.

On the other hand, preferably, portions of the first and second ground lines 13, 14 in the test board 10*a* and the test board 10*b*, which are bonded to or make contact with the signal shielding fence 40, may have the same shape as the signal shielding fence 40. In an embodiment, the first and second ground lines 13, 14 and the signal shielding fence 40 can have a same width.

The signal shielding fence 40 is preferably formed of a conductor, such as a metal.

In an embodiment, the signal shielding fence 40 and the first and second ground lines 13, 14 formed along the signal shielding fence 40 are adapted to discriminate the section 11, which is sensitive to an influence of electrical signals, from other sections of the test board 10*a*, for example, section 12. In an embodiment, the signal shielding fence 40 has a closed circuit shape surrounding section 11 of the test board 10*a*, which is sensitive to the influence of the electrical signals.

However, in the case in which the area of the section 11 sensitive to influence of electrical signals is larger than that of section 12, since it is advantageous that the large area section surrounds the small area section, the signal shielding fence 40 may be formed in a closed circuit shape surrounding the small area section.

Further, the signal shielding fence 40 is formed higher than a height of the highest one of the mounting devices 50*a* mounted to the test board 10*a*. Further, test board 10*a* and an adjacent test board 10*b* can be spaced apart 20 from each other by a predetermined distance, or height, wherein the signal shielding fence 40 can have a height that is less than the height between the test board 10*a* and the test board 10*b*.

In an embodiment, if section 11, which is sensitive to influence of electrical signals, and section 12 are separated from each other in the test board 10*a* by the first ground line 13 and the signal shielding fence 40, the influence of the mutual electrical signals can be completely interrupted and the section 11 sensitive to electrical signals may be protected from section 12, thereby safely performing a precise electrical inspection through the mounting devices 50*a* included in section 11, thereby allowing a precise and accurate inspection.

Accordingly, in a structure in which a plurality of test boards are provided in parallel according to their functions, a signal shielding fence is provided to interrupt influence of mutual electrical signals at a border portion with a section including mounting devices which are not sensitive to external electrical signals, thereby minimizing or shielding influence of the electrical signals. Therefore, a high-precision inspection and a low current measurement can be performed through the mounting devices sensitive to external electrical signals, thereby remarkably improving the safety, the availability, and the reliability of the inspection.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multilayer test board assembly for high-precision inspection, comprising:
   a plurality of test boards separated from each other according to their functions, having input/output signal terminals, and including at least one test board each having a first section where first mounting devices sensitive to an influence of electrical signals are mounted and a second section where second mounting devices insensitive to an influence of electrical signals are mounted;

spacers that arrange the test boards in parallel by spacing apart the test boards at predetermined intervals;

connection cables connected to the input/output signal terminals of the test boards; and a signal shielding fence formed on each of the at least one test board so as to protect the first mounting devices from electrical signals generated by the second mounting devices, wherein the signal shielding fence has a height that is lower than a height of the spacers, wherein a ground line is formed on each of the at least one test board, wherein the signal shielding fence is connected to the ground line, and wherein the signal shielding fence has a closed circuit shape surrounding any one of the first section and the second section.

2. The multilayer test board assembly according to claim 1, wherein the signal shielding fence has a closed circuit shape surrounding any one of the first section and the second section.

3. The multilayer test board assembly according to claim 1, wherein the signal shielding fence is formed of a conductor.

4. The multilayer test board assembly according to claim 3, wherein the conductor is a metal.

5. The multilayer test board assembly according to claim 1, wherein the signal shielding fence has a height that is higher than a height of the highest of the first and second mounting devices.

6. A multilayer test board assembly for high-precision inspection, comprising:

a plurality of test boards separated from each other according to their functions, having input/output signal terminals, and including adjacent first and second test boards, the second test board being positioned over the first test board, and the first board having a first section where first mounting devices sensitive to an influence of electrical signals are mounted and a second section where second mounting devices insensitive to an influence of electrical signals are mounted;

spacers that arrange the test boards in parallel by spacing apart the test boards by predetermined intervals;

connection cables connecting the input/output signal terminals of the test boards; and a signal shielding fence on a first ground line formed on the first test board and being in contact with a second ground line formed on a surface of the second test board facing the first ground line so as to protect the first mounting devices from electrical signals generated by the second mounting devices, wherein the signal shielding fence has a height that is lower than a height of the spacers.

7. The multilayer test board assembly according to claim 6, wherein the signal shielding fence is formed of a conductor.

8. The multilayer test board assembly according to claim 7, wherein the conductor is a metal.

9. The multilayer test board assembly according to claim 6, wherein the signal shielding fence has a closed circuit shape surrounding any one of the first section and the second section.

10. The multilayer test board assembly according to claim 7, wherein the signal shielding fence has a closed circuit shape surrounding any one of the first section and the second section.

11. The multilayer test board assembly according to claim 6, wherein the signal shielding fence has a height that is higher than a height of the highest of the first and second mounting devices.

* * * * *